(12) United States Patent
Troy et al.

(10) Patent No.: US 9,487,395 B2
(45) Date of Patent: Nov. 8, 2016

(54) METHOD OF FORMING PLANAR SACRIFICIAL MATERIAL IN A MEMS DEVICE

(71) Applicant: CAVENDISH KINETICS, INC., San Jose, CA (US)

(72) Inventors: Brian I. Troy, San Mateo, CA (US); James F. Bobey, Gilroy, CA (US); Mickael Renault, San Jose, CA (US); Joseph Damian Gordon Lacey, Milpitas, CA (US); Thomas L. Maguire, Santa Clara, CA (US)

(73) Assignee: CAVENDISH KINETICS, INC., San Jose, CA (US)

( * ) Notice: Subject to any disclaimer, the term of this patent is extended or adjusted under 35 U.S.C. 154(b) by 0 days.

(21) Appl. No.: 14/914,504

(22) PCT Filed: Sep. 2, 2014

(86) PCT No.: PCT/US2014/053659
§ 371 (c)(1),
(2) Date: Feb. 25, 2016

(87) PCT Pub. No.: WO2015/034809
PCT Pub. Date: Mar. 12, 2015

(65) Prior Publication Data
US 2016/0207763 A1 Jul. 21, 2016

Related U.S. Application Data

(60) Provisional application No. 61/872,922, filed on Sep. 3, 2013.

(51) Int. Cl.
*H01L 21/00* (2006.01)
*B81C 1/00* (2006.01)
*H01G 5/16* (2006.01)

(52) U.S. Cl.
CPC ............ *B81C 1/00611* (2013.01); *H01G 5/16* (2013.01)

(58) Field of Classification Search
CPC ........................... B81C 1/00611; H01G 5/16
See application file for complete search history.

(56) References Cited

U.S. PATENT DOCUMENTS 5,272,307 A * 12/1993 Jones ................. B23K 1/0056
219/121.6
6,501,051 B1 * 12/2002 Richert ............ H01L 21/67115
219/388

(Continued)

FOREIGN PATENT DOCUMENTS

DE 102009000056 A1 7/2010
WO 2006/087045 A1 8/2006

(Continued)

*Primary Examiner* — Laura Menz
(74) *Attorney, Agent, or Firm* — Patterson & Sheridan, LLP

(57) ABSTRACT

The present invention generally relates to a method of fabricating a MEMS device. In the MEMS device, a movable plate is disposed within a cavity such that the movable plate is movable within the cavity. To form the cavity, sacrificial material may be deposited and then the material of the movable plate is deposited thereover. The sacrificial material is removed to free the mov able plate to move within the cavity. The sacrificial material, once deposited, may not be sufficiently planar because the height difference between the lowest point and the highest point of the sacrificial material may be quite high. To ensure the movable plate is sufficiently planar, the planarity of the sacrificial material should be maximized. To maximize the surface planarity of the sacrificial material, the sacrificial material may be deposited and then conductive heated to permit the sacrificial material to reflow and thus, be planarized.

23 Claims, 7 Drawing Sheets

(56) References Cited

U.S. PATENT DOCUMENTS

| | | | | |
|---|---|---|---|---|
| 7,980,671 B2* | 7/2011 | Nystrom | ................... | B41J 2/14 |
| | | | | 347/54 |
| 2001/0030184 A1* | 10/2001 | Richert | ............ | H01L 21/67115 |
| | | | | 219/388 |
| 2003/0223174 A1* | 12/2003 | Prophet | ............... | H01H 1/0036 |
| | | | | 361/115 |
| 2004/0211817 A1* | 10/2004 | Jin | ........................... | B23K 1/20 |
| | | | | 228/42 |
| 2006/0110893 A1* | 5/2006 | Quenzer | ............ | B81C 1/00611 |
| | | | | 438/455 |
| 2013/0113086 A1 | 5/2013 | Bai et al. | | |
| 2014/0339688 A1* | 11/2014 | Gaddi | ................... | B81B 7/0064 |
| | | | | 257/659 |
| 2016/0207763 A1* | 7/2016 | Troy | ....................... | H01G 5/16 |
| 2016/0240320 A1* | 8/2016 | Renault | ................... | H01G 5/16 |

FOREIGN PATENT DOCUMENTS

| | | | | |
|---|---|---|---|---|
| WO | WO 2015034809 A2 * | 3/2015 | ......... | B81C 1/00611 |
| WO | WO 2015034809 A3 * | 5/2015 | ......... | B81C 1/00611 |

\* cited by examiner

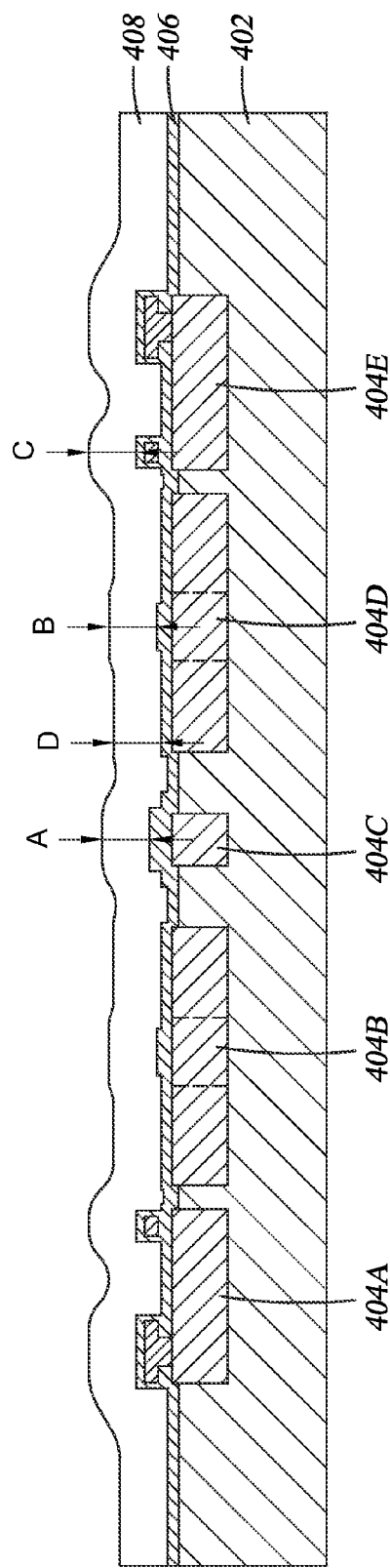
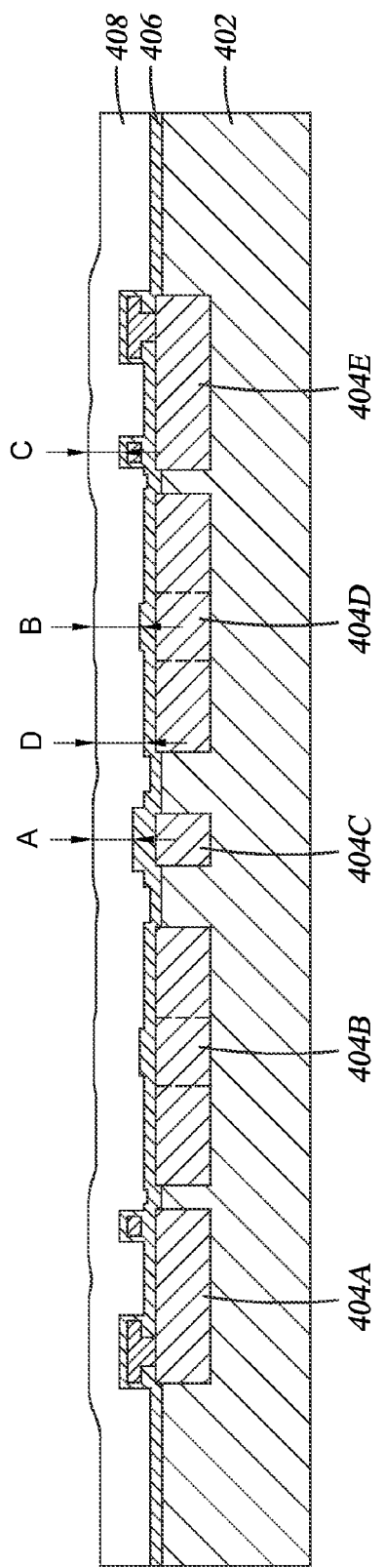
Fig. 4A
Fig. 4B

US 9,487,395 B2

METHOD OF FORMING PLANAR SACRIFICIAL MATERIAL IN A MEMS DEVICE

BACKGROUND OF THE INVENTION

1. Field of the Invention

Embodiments of the present invention generally relate to a method of forming a planar sacrificial layer in a cavity of a MEMS device.

2. Description of the Related Art

MEMS devices typically include a movable plate (i.e., switching element) that is movable between multiple positions, such as between a position in close contact with an electrode and a position spaced from the electrode. Some MEMS devices are used in digital variable capacitors (DVC).

Some DVC devices are based on a moveable MEMS element with a control-electrode above (i.e., a pull-up or pull-off or PU-electrode) and below (i.e., a pull-in or pull-down or PD-electrode) the moveable MEMS element, as shown schematically in FIG. 1. In addition there is an RF-electrode below the moveable MEMS element (i.e., plate or cantilever or movable plate electrode). During operation a voltage is applied to either the PU or PD-electrode, which causes the MEMS element to be pulled-up or pulled-down in contact to provide a stable minimum or maximum capacitance to the RF-electrode. In this way the capacitance from the moveable element to the RF-electrode (which resides below the moveable element) can be varied from a high capacitance $C_{max}$ when pulled to the bottom (See FIG. 2) to a low capacitance $C_{min}$ (See FIG. 3) when pulled to the top.

Thus, the distance between the movable plate and the RF electrode affects the capacitance. If the movable plate has a non-uniform shape, the capacitance of each MEMS device may be unique and thus, device to device repeatability may be difficult. In order to have repeatable, consistent capacitances, the movable plate should be substantially planar.

Therefore, there is a need in the art for forming a planar movable plate in a MEMS device.

SUMMARY OF THE INVENTION

The present invention generally relates to a method of fabricating a MEMS device. In the MEMS device, a movable plate is disposed within a cavity such that the movable plate is movable within the cavity. To form the cavity, sacrificial material may be deposited and then the material of the movable plate is deposited thereover. The sacrificial material is removed to free the movable plate to move within the cavity. The sacrificial material, once deposited, may not be sufficiently planar because the height difference between the lowest point and the highest point of the sacrificial material may be quite high. To ensure the movable plate is sufficiently planar, the planarity of the sacrificial material should be maximized. To maximize the surface planarity of the sacrificial material, the sacrificial material may be deposited and then conductive heated to permit the sacrificial material to reflow and thus, be planarized.

In one embodiment, a method of forming a MEMS device comprises depositing a sacrificial layer over a substrate; conduction heating the substrate and sacrificial layer to reflow the sacrificial layer and substantially planarized the sacrificial layer; forming a movable plate over the sacrificial layer; defining a cavity enclosing the sacrificial layer and the movable plate; and removing the sacrificial layer from the cavity.

In another embodiment, a method of forming a MEMS device comprises depositing a sacrificial layer over a substrate; conduction heating the substrate and sacrificial layer to reflow the sacrificial layer and substantially planarized the sacrificial layer, wherein the sacrificial layer is heated from a first surface facing the substrate to a second surface opposite the first surface such that the first surface is exposed to the conduction heating prior to the second surface; forming a movable plate over the sacrificial layer; defining a cavity enclosing the sacrificial layer and the movable plate; and removing the sacrificial layer from the cavity.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 4A-4F are schematic cross-sectional illustrations of a MEMS DVC at various stages of manufacturing.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

The present invention generally relates to a method of fabricating a MEMS device. In the MEMS device, a movable plate is disposed within a cavity such that the movable plate is movable within the cavity. To form the cavity, sacrificial material may be deposited and then the material of the movable plate is deposited thereover. The sacrificial material is removed to free the movable plate to move within the cavity. The sacrificial material, once deposited, may not be sufficiently planar because the height difference between the lowest point and the highest point of the sacrificial material may be quite high. To ensure the movable plate is sufficiently planar, the planarity of the sacrificial material should be maximized. To maximize the surface planarity of the sacrificial material, the sacrificial material may be deposited and then conductive heated to permit the sacrificial material to reflow and thus, be planarized.

Figure 1:
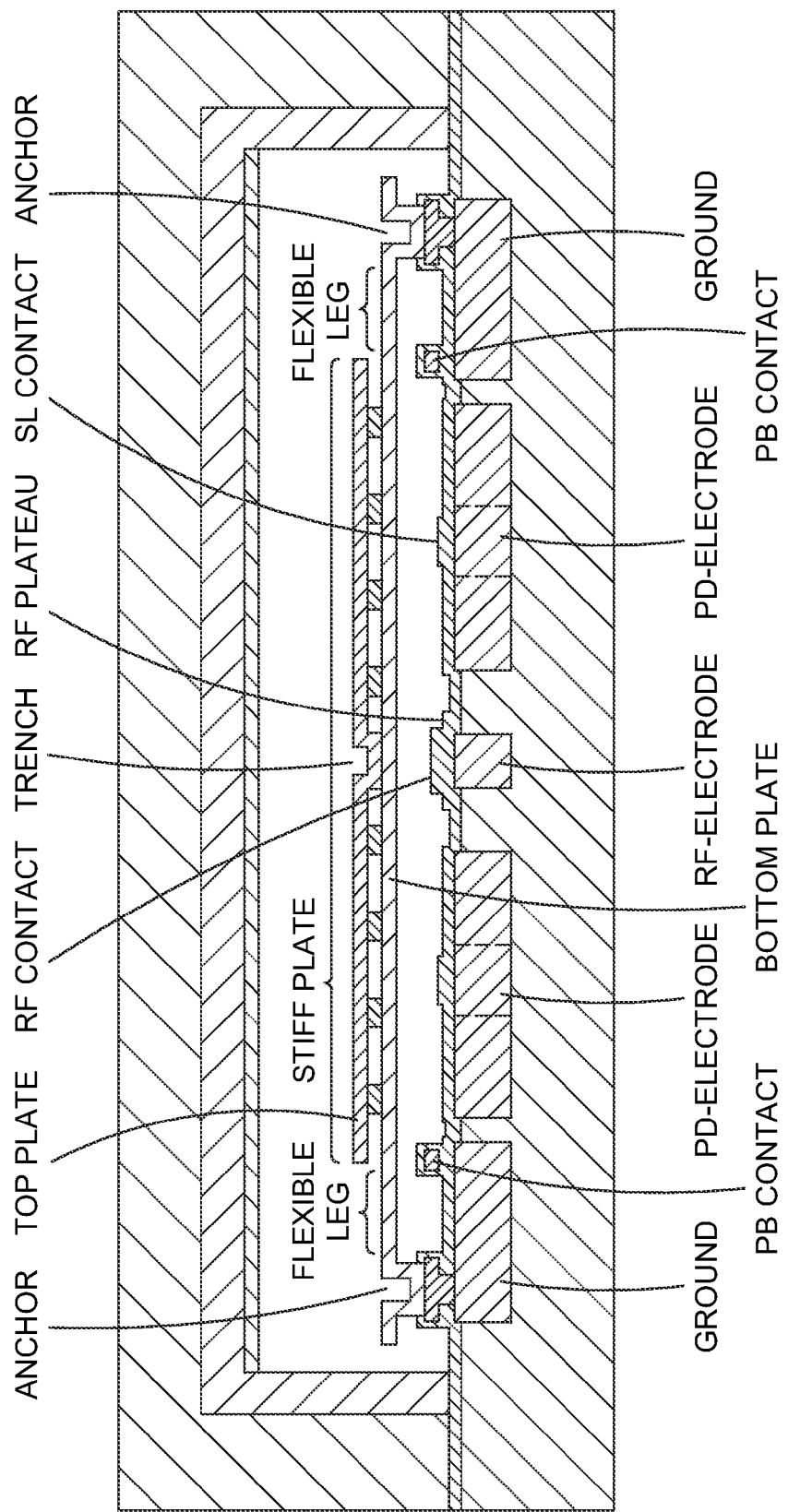
FIG. 1 is a schematic cross-sectional illustration of a MEMS DVC in the free standing state.
Figure 2:
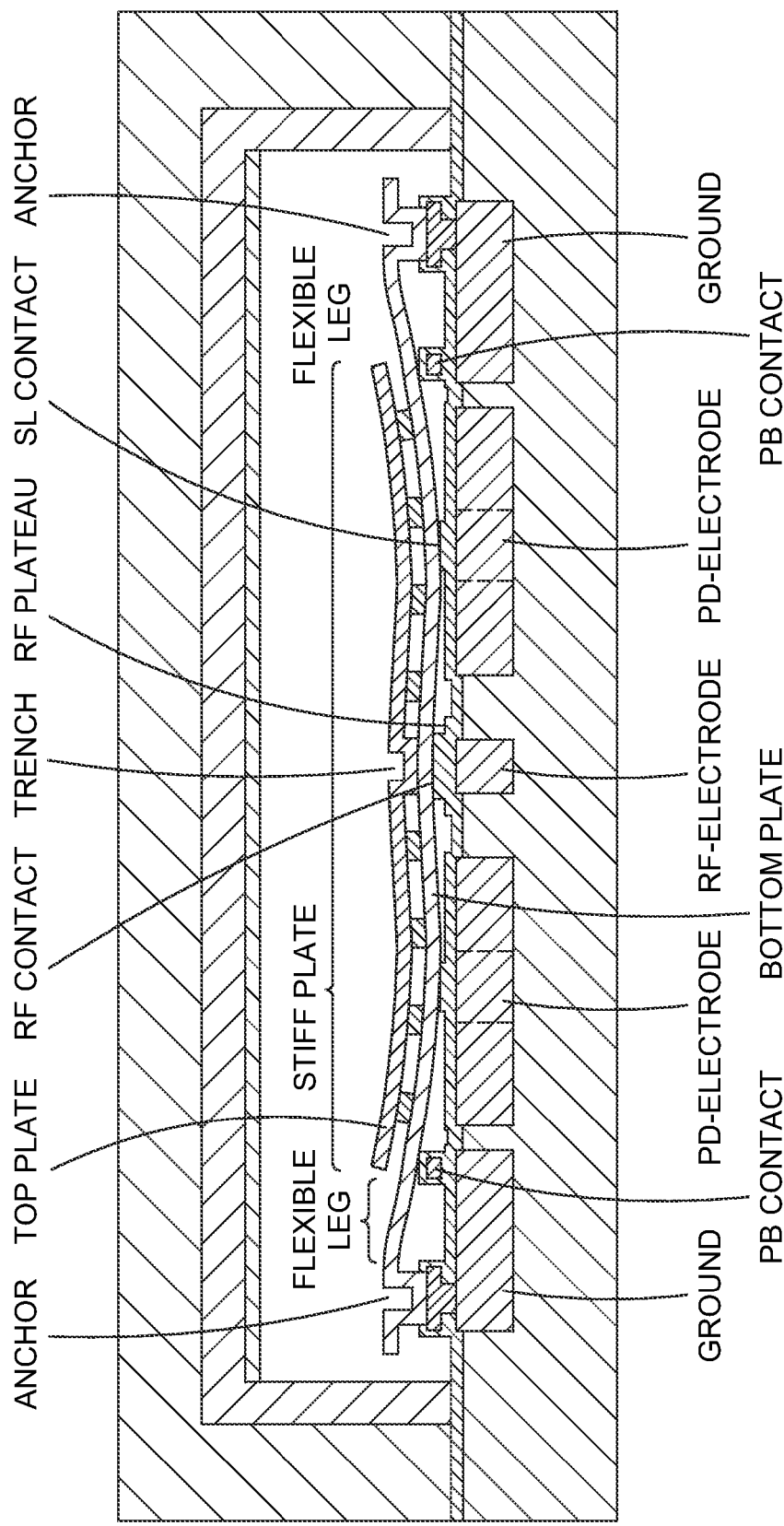
FIG. 2 is a schematic cross-sectional illustration of the MEMS DVC of FIG. 1 in the $C_{max}$ state.
Figure 3:
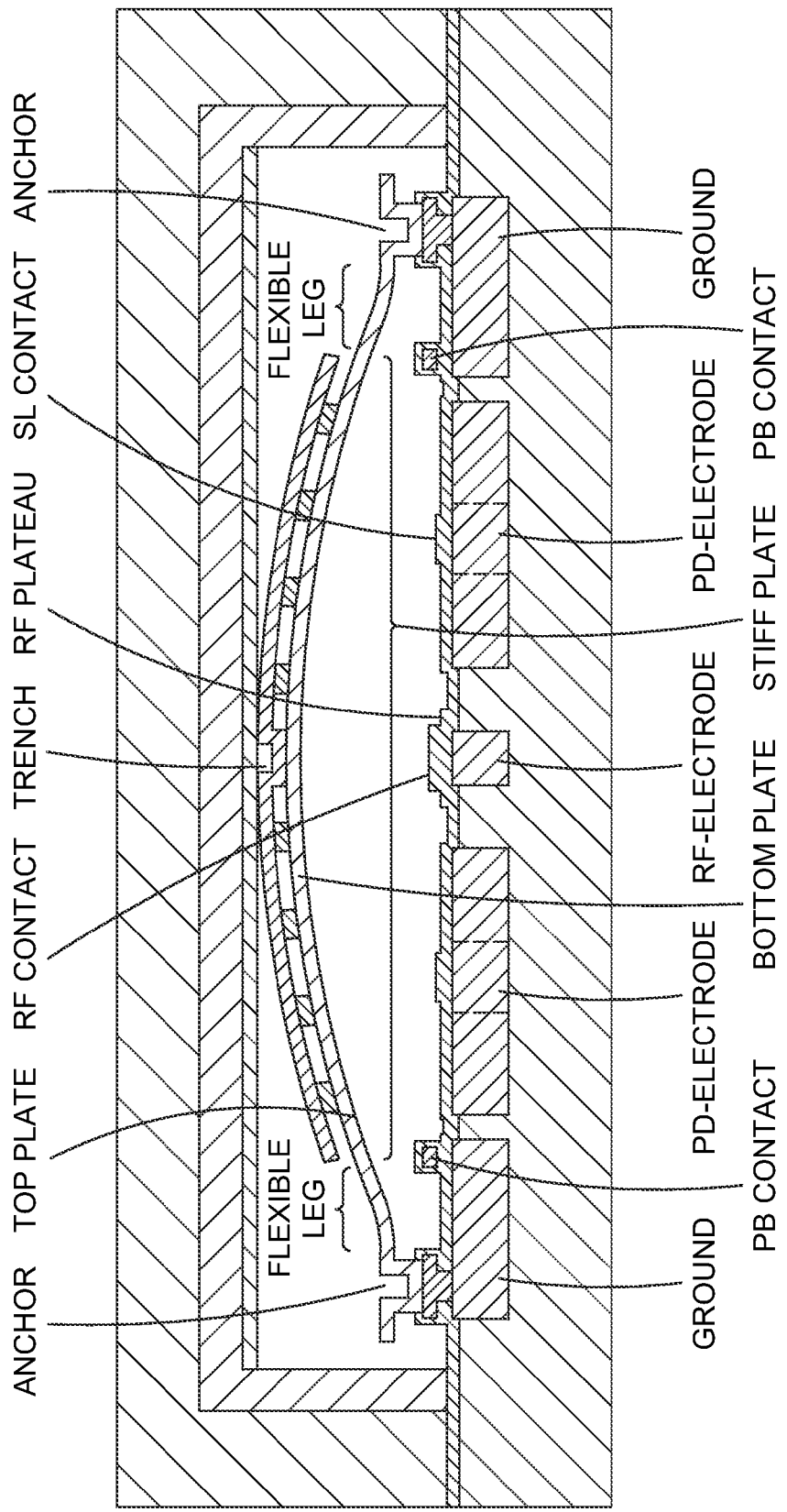
FIG. 3 is a schematic cross-sectional illustration of the MEMS DVC of FIG. 1 in the $C_{min}$ state.
Figure 4C:
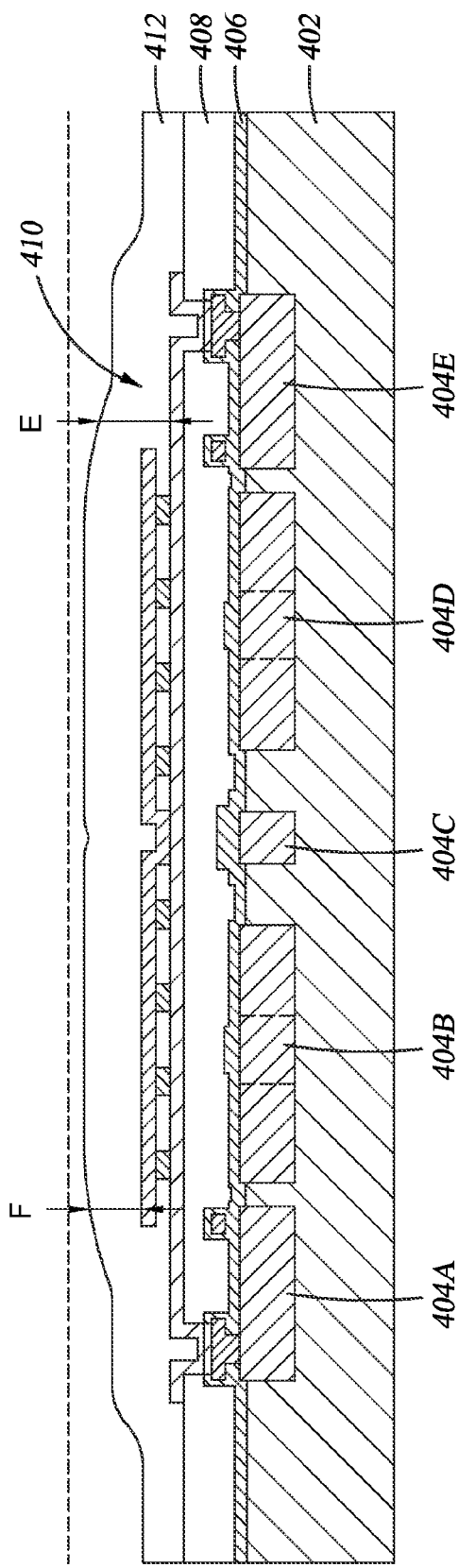

FIGS. 4A-4F show a MEMS device 400 at various stages of manufacturing. As shown in FIG. 4A, a substrate 402 has a plurality of electrodes 404A-404E disposed therein. In one embodiment, the substrate 402 may comprise silicon. It is to be understood that the substrate 402 may comprise other materials instead of or in addition to silicon. For example, the substrate 402 may comprise a multi-layer structure. The electrodes 404A-404E may comprise an electrically conductive material such as titanium-aluminum nitride, copper, titanium, tungsten, titanium nitride, and alloys thereof. Electrodes 404A, 404E are coupled to ground while electrodes 404B, 404D are coupled to a power supply to function as pull-in electrodes. Electrode 404C is the RF electrode. A dielectric layer 406 is deposited over the electrodes 404A-404E and the substrate 402. Suitable dielectric materials that may be used include silicon nitride and silicon oxide. If desired, an adhesion promoter layer may be deposited over the substrate 402 prior to depositing the dielectric layer 406.

A first sacrificial layer 408 is formed over the dielectric layer 406. The sacrificial layer 408 will later be removed and thus, serves to define what will eventually be the cavity of the MEMS device 400. The first sacrificial layer 408 may be deposited by a spin-on deposition process. In one embodiment, the first sacrificial layer 408 may be an organic material and contain carbon, hydrogen, nitrogen and oxygen. As shown in FIG. 4A, the first sacrificial layer 408 may not be sufficiently planar, which would be detrimental to forming the movable plate. As shown in FIG. 4A, the first sacrificial layer 408, over the RF contact, has a thickness "A" and thus, extends for a first distance above the dielectric layer 406. The first sacrificial layer 408 has a thickness "B" above the SL contact, a thickness "C" above the PB contact and a thickness "D" above the electrodes 404B, 404D. "A", "B", "C" and "D" are substantially the same however, the RF contact, the SL contact, the PB contact and the electrodes 404B, 404D all extend above the substrate a different distance. Thus, the first sacrificial layer 408 is not substantially planar and therefore the bottom beam, if deposited, would have an uneven bottom surface.

The good functionality of the device requires the beam to touch the RF contact prior to touching the SL contact, and to never touch the dielectric layer over electrodes 404B, 404D. In other words, the beam will touch the area corresponding to double area "B", but not touch where double arrow "D" is. The distance between these areas and the first dielectric layer 408 surface is represented by the double arrows A, B, and D. In FIG. 4A where poor planarity exists, distances A, B and D are substantially identical resulting in a poor performance of the MEMS.

It is contemplated that other planarity issues can be corrected as well. For example, rather than poor planarity over a substrate having an uneven surface, poor planarity may occur over a substantially planar substrate. Such non-planarity may occur as a center to edge variation. It is contemplated that the techniques described herein are equally applicable to such situations.

In order to planarize or smooth out the first sacrificial layer 408, the first sacrificial layer is heated by thermal conduction heating. In one embodiment, the substrate 402 having the first sacrificial layer 408 thereover may be placed on a hot plate that is maintained at a temperature of between about 250 degrees Celsius and about 450 degrees Celsius while in a non-oxidizing/non-reducing gas atmosphere. Suitable gas mixtures that may be present in the gas atmosphere include $N_2$ at a chamber pressure of about 1 Torr. In one embodiment, the heating may occur at a temperature of between about 300 degrees Celsius and about 450 degrees Celsius. Because the substrate 402 is disposed on the hot plate, the substrate heats first and then, the first sacrificial layer 408 is heated through the substrate 402. Thus, the first sacrificial layer 408 softens and reflows to a more planar surface. Additionally, once the first sacrificial layer 408 reaches an equilibrium temperature with the substrate 402 and hence, hot plate, the first sacrificial layer 408 is cured. The resulting first sacrificial layer 408 is substantially planar as shown in FIG. 4B such that "A", "B", "C" and "D" are no longer substantially identical as shown in FIG. 4B. Thus, the sacrificial layer 408 is substantially planar across the entire length. This means distance A would be shorter than distance B and distance D would be longer than distance B. It insures good device functionality.

If the first sacrificial layer 408 were heated in an annealing chamber or an oven, the first sacrificial layer 408 would not reflow and cure as well as when using a hot plate. In an oven or annealing chamber, the top surface of the first sacrificial layer 408 would heat first and hence, form a crust or skin effect. In so forming a crust, the first sacrificial layer 408 has not sufficiently reflowed before curing and thus, the surface is less planar than when heated with a hot plate. The crust prevents the bulk of the first sacrificial layer 408 from relaxing and reflowing to a more planar state. Without a significant reflow, the desired planarity may not be achieved.

Once the first sacrificial layer 408 has been planarized, openings may be formed through both the first sacrificial layer 408 as well as the dielectric layer 406 to expose the grounded electrodes 404A, 404E. Electrically conductive material that forms the movable plate 410 may be deposited both within the holes as well as over the planar surface of the first sacrificial layer 408. While not shown, it is contemplated that a dielectric layer may be deposited over the first sacrificial layer 408 and then the movable plate 410 may be formed thereover. The movable plate 410 may comprise an electrically conductive material such as titanium-aluminum nitride, copper, titanium, tungsten, titanium nitride, and alloys thereof. The movable plate 410 comprises multiple layers such as a top plate spaced from a bottom plate with connecting posts to form a waffle structure. If forming a waffle structure for the movable plate 410, an additional sacrificial layer may be present between the plates with the posts formed therethrough. The posts may be formed by forming a sacrificial layer over the bottom layer of conductive material followed by etching vias through the sacrificial layer to expose the underlying bottom layer. Conductive material is then filled into the vias. The top layer of the movable plate 410 is then deposited. In one embodiment, the vias may be substantially filled such that the posts are solid. In another embodiment, the vias may be lined such that the posts are hollow. In either embodiment, the posts comprise electrically conductive material to electrically connect the top layer to the bottom layer of the movable plate 410. Additionally, while not shown, contact bumps may be formed on the top layer facing the top electrode such that the contact area between the top dielectric and the movable plate 410 is limited so that a sticking is minimized and a consistent $C_{min}$ is realized.

Figure 4D:
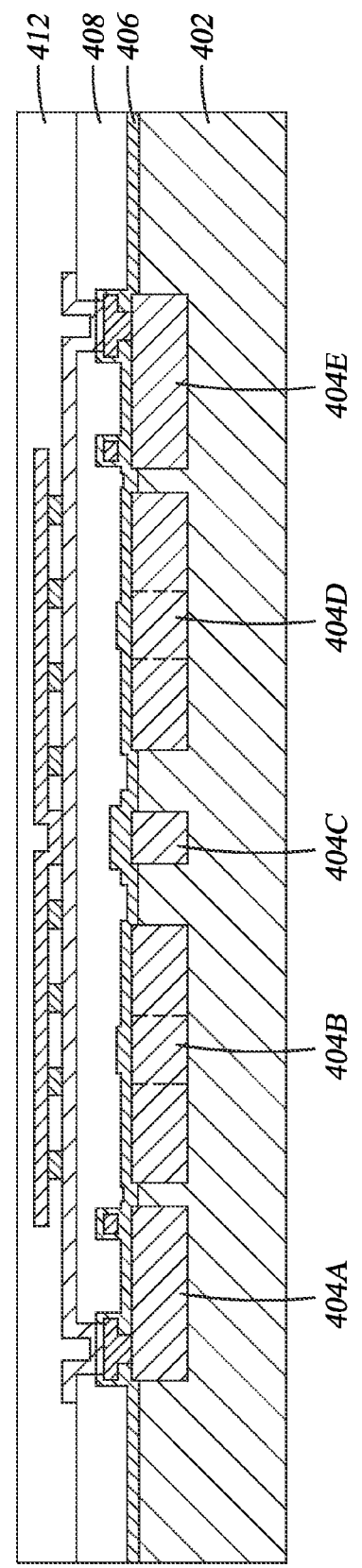

Once the movable plate 410 has been formed, a second sacrificial layer 412 may be deposited thereover as shown in FIG. 4C. The second sacrificial layer 412 may be deposited and have an insufficient planarity as shown by different thicknesses represented by arrows "E" and "F" such that the planarization length of the second sacrificial layer 412 is insufficient. Such poor planarization leads to the second sacrificial layer 412 being spaced by different distances from where the top dielectric layer will be. Hence, the distance to the roof of the device will be different near the center of the top plate than for the edge of the top plate, which will negatively impact device performance. The second sacrificial layer 412 may be reflowed and cured under the same conditions as discussed above with regards to the first sacrificial layer 408 to ensure the second sacrificial layer 412 is substantially planar. However, it is to be understood that the second sacrificial layer 412 may be heated in a manner different than the first sacrificial layer if desired as the movable plate 410 has already been formed and is substantially planar as shown in FIG. 4D.

Figure 4E:
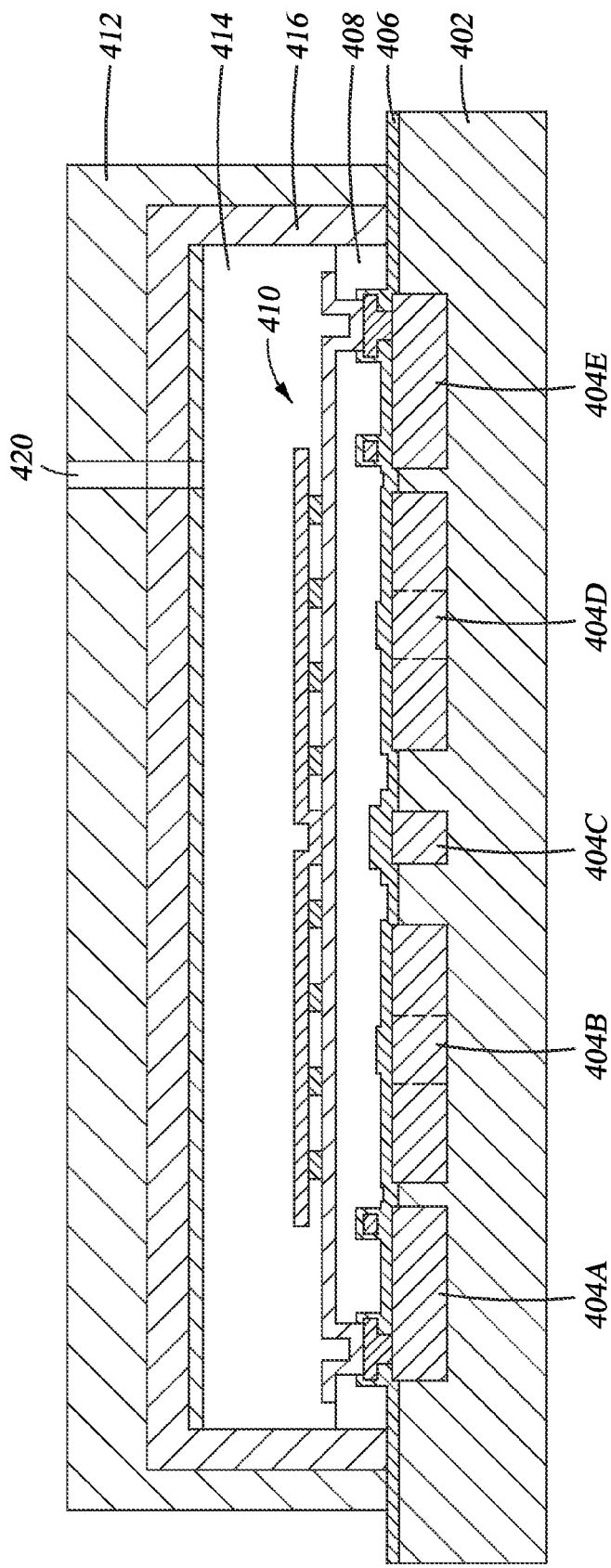
Figure 4F:
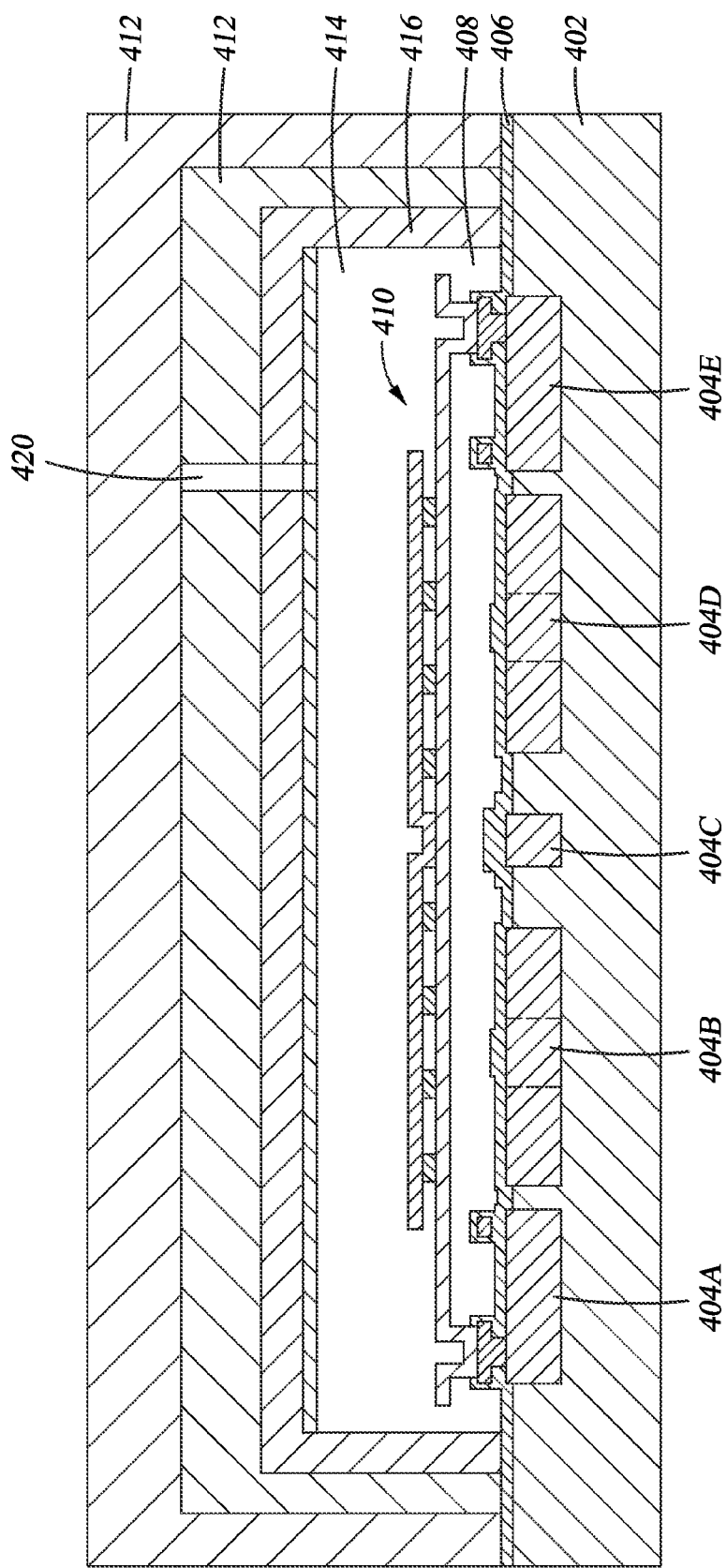

Once the second sacrificial layer 412 has been planarized, a dielectric layer 414 and the pull-up electrode 416 may be formed. A capping layer 418 may also be deposited over the pull-up electrode and surrounding the sacrificial layers 408, 412. The capping layer 418 defines the boundaries of the cavity to be formed. An opening 420 is formed through the capping layer 418 as shown in FIG. 4E. An etchant is introduced through the opening 420 to etch away both the first sacrificial layer 408 and the second sacrificial layer 412 so that the movable plate 410 is freely movable within the cavity 424.

By heating the sacrificial layer with a hot plate and thermally conductively heating the sacrificial layer from the bottom surface (i.e., the surface facing the substrate) up to the top surface (i.e., the surface facing the movable plate), the sacrificial layer will reflow to a substantially planar top surface before curing and therefore, the sacrificial layer will have a planarizing length that encompasses substantially the entire length of the sacrificial layer. The conductive heating will result in a substantially planar surface with a substantially uniform topography. Thus, a substantially planar movable plate may be formed thereover and MEMS devices can be reliably formed with consistent capacitances.

While the foregoing is directed to embodiments of the present invention, other and further embodiments of the invention may be devised without departing from the basic scope thereof, and the scope thereof is determined by the claims that follow.

The invention claimed is:

1. A method of forming a MEMS device, comprising:
   depositing a sacrificial layer over a substrate;
   conduction heating the substrate and sacrificial layer to reflow the sacrificial layer and substantially planarized the sacrificial layer;
   forming a movable plate over the sacrificial layer;
   defining a cavity enclosing the sacrificial layer and the movable plate; and
   removing the sacrificial layer from the cavity.

2. The method of claim 1, wherein the sacrificial layer is deposited by a spin-on process.

3. The method of claim 2, wherein the conduction heating comprises heating the substrate on a hot plate that is maintained at a temperature of between about 250 degrees Celsius and about 450 degrees Celsius.

4. The method of claim 3, wherein the conduction heating is performed in an atmosphere comprising a non-oxidizing and non-reducing gas mixture.

5. The method of claim 4, wherein the gas mixture comprises $N_2$.

6. The method of claim 5, wherein the temperature is between about 300 degrees Celsius and about 450 degrees Celsius.

7. The method of claim 6, wherein the conduction heating occurs by heating the substrate with a hot plate.

8. The method of claim 7, further comprising forming an adhesion promoter layer over the substrate and then forming the sacrificial layer over the adhesion promoter layer.

9. The method of claim 8, wherein the sacrificial layer comprises carbon, hydrogen, nitrogen and oxygen.

10. The method of claim 9, wherein the conduction heating occurs at a pressure of about 1 Torr.

11. The method of claim 1, wherein the conduction heating occurs at a pressure of about 1 Torr.

12. The method of claim 1, wherein the movable plate comprises a bottom layer, a top layer, and a plurality of posts coupling the bottom layer to the top layer.

13. The method of claim 12, wherein the posts are hollow.

14. The method of claim 12, wherein the movable plate has one or more bumps thereon facing a top of the cavity.

15. A method of forming a MEMS device, comprising:
   depositing a sacrificial layer over a substrate;
   conduction heating the substrate and sacrificial layer to reflow the sacrificial layer and substantially planarized the sacrificial layer, wherein the sacrificial layer is heated from a first surface facing the substrate to a second surface opposite the first surface such that the first surface is exposed to the conduction heating prior to the second surface, wherein the heating occurs at a temperature of between about 250 degrees Celsius to about 450 degrees Celsius;
   forming a movable plate over the sacrificial layer;
   defining a cavity enclosing the sacrificial layer and the movable plate; and
   removing the sacrificial layer from the cavity.

16. The method of claim 15, wherein the conduction heating is performed in an atmosphere comprising a non-oxidizing and non-reducing gas mixture.

17. The method of claim 16, wherein the gas mixture comprises $N_2$.

18. The method of claim 17, wherein the temperature is between about 300 degrees Celsius and about 450 degrees Celsius.

19. The method of claim 18, wherein the conduction heating occurs by heating the substrate with a hot plate.

20. The method of claim 19, further comprising forming an adhesion promoter layer over the substrate and then forming the sacrificial layer over the adhesion promoter layer.

21. The method of claim 20, wherein the sacrificial layer comprises carbon, hydrogen, nitrogen and oxygen.

22. The method of claim 21, wherein the conduction heating occurs at a pressure of about 1 Torr.

23. The method of claim 15, wherein the conduction heating occurs at a pressure of about 1 Torr.

* * * * *